United States Patent
Suzuki

(10) Patent No.: US 12,191,362 B2
(45) Date of Patent: Jan. 7, 2025

(54) STACKED SEMICONDUCTOR DEVICES IN SEALANTS AND INTERCONNECTED WITH PILLAR ELECTRODES

(71) Applicant: AOI Electronics Co., Ltd., Takamatsu (JP)

(72) Inventor: Takashi Suzuki, Takamatsu (JP)

(73) Assignee: AOI Electronics Co., Ltd, Takamatsu (JP)

( * ) Notice: Subject to any disclaimer, the term of this patent is extended or adjusted under 35 U.S.C. 154(b) by 325 days.

(21) Appl. No.: 17/690,788

(22) Filed: Mar. 9, 2022

(65) Prior Publication Data
US 2022/0293748 A1    Sep. 15, 2022

(30) Foreign Application Priority Data
Mar. 11, 2021    (JP) .................................. 2021-39205

(51) Int. Cl.
*H01L 29/41* (2006.01)
*H01L 29/40* (2006.01)
*H01L 29/49* (2006.01)

(52) U.S. Cl.
CPC ............ *H01L 29/41* (2013.01); *H01L 29/401* (2013.01); *H01L 29/49* (2013.01)

(58) Field of Classification Search
CPC ..... H01L 29/49; H01L 24/81; H01L 25/0657; H01L 2225/06513; H01L 25/0652
See application file for complete search history.

(56) References Cited

U.S. PATENT DOCUMENTS

2012/0119391 A1    5/2012    Koizumi et al.
2014/0038353 A1*   2/2014    Kim .................... H01L 23/3135
                                                                438/107
(Continued)

FOREIGN PATENT DOCUMENTS

JP        2012-109297 A    6/2012
WO     WO 2019/240901 A1   12/2019

OTHER PUBLICATIONS

Japanese-language Office Action issued in Japanese Application No. 2021-039205 dated Aug. 1, 2023 with English translation (8 pages).

*Primary Examiner* — Wasiul Haider
(74) *Attorney, Agent, or Firm* — Crowell & Moring LLP

(57) ABSTRACT

Problem: To reduce the likelihood of insufficient electrical continuity in wiring in a semiconductor device. Solution: A method for manufacturing a semiconductor device includes placing, on a substrate surface, a first semiconductor element having a first surface on which a first pillar electrode is formed, via a surface opposite to the first surface, sealing a substrate-side pillar electrode and the first pillar electrode with a first sealant, removing a part of the first sealant to expose an end of the substrate-side pillar electrode and an end of the first pillar electrode, forming, on the first sealant, a plating layer electrically connected to the substrate-side pillar electrode and the first pillar electrode by plating, removing a part of the plating layer to form a residual plating layer, coupling a second semiconductor element onto the residual plating layer or a metal layer or a wiring layer formed on the residual plating layer, and sealing the residual plating layer and the second semiconductor element using a second sealant such that the first sealant is in contact with the second sealant.

6 Claims, 8 Drawing Sheets

(56) References Cited

U.S. PATENT DOCUMENTS

| | | | |
|---|---|---|---|
| 2019/0006315 A1 | 1/2019 | Hsu et al. | |
| 2019/0385977 A1* | 12/2019 | Elsherbini | H01L 25/105 |
| 2020/0273843 A1* | 8/2020 | Zhong | H01L 24/20 |

* cited by examiner

STACKED SEMICONDUCTOR DEVICES IN SEALANTS AND INTERCONNECTED WITH PILLAR ELECTRODES

TECHNICAL FIELD

The present invention relates to a method for manufacturing a semiconductor device, and a semiconductor device.

BACKGROUND ART

In a method for manufacturing a semiconductor device, a semiconductor element is placed on a substrate via a surface of the semiconductor element opposite to a surface where a terminal is arranged, and an electrode connected to the terminal is coupled to another semiconductor element (see Patent Literature 1).

CITATION LIST

Patent Literature

Patent Literature 1: U.S. Patent Application Publication No. 2019/0006315 Specification

SUMMARY

Technical Problem

In some cases, misalignment in arranging a semiconductor element on a substrate causes insufficient electrical continuity in wiring in a semiconductor device.

Solution to Problem (1) According to a first aspect of the present invention, a method for manufacturing a semiconductor device includes forming a substrate-side pillar electrode on a substrate surface that is one of surfaces of a substrate, placing, at a position of the substrate surface, a first semiconductor element having a first surface on which a first pillar electrode is formed, via a surface opposite to the first surface, the substrate-side pillar electrode being not formed at the position, sealing the substrate-side pillar electrode and the first pillar electrode with a first sealant, removing a part of the first sealant to expose an end of the substrate-side pillar electrode and an end of the first pillar electrode, forming, on the first sealant, a plating layer electrically connected to the substrate-side pillar electrode and the first pillar electrode by plating, removing a part of the plating layer to form a residual plating layer, coupling a second semiconductor element onto the residual plating layer or a metal layer or a wiring layer formed on the residual plating layer, and sealing the residual plating layer and the second semiconductor element using a second sealant such that the first sealant is in contact with the second sealant.

(2) According to a second aspect of the present invention, a semiconductor device includes a first semiconductor element having a first surface provided with a first pillar electrode, and a second semiconductor element having a second surface provided with a plurality of second pillar electrodes. The semiconductor device further includes a connecting layer electrically connecting a second pillar electrode formed in a first portion of the second surface to the first pillar electrode, the first portion facing the first surface, a third pillar electrode electrically connecting a second pillar electrode formed in a second portion of the second surface to an outside of the semiconductor device, the second portion being different from the first portion, a first sealant sealing the first pillar electrode and the third pillar electrode, and a second sealant in contact with the first sealant, the second sealant sealing the plurality of second pillar electrodes.

Advantageous Effects of Invention

According to the present invention, it is possible to reduce the likelihood of insufficient electrical continuity in wiring in a semiconductor device due to misalignment in arranging a semiconductor element on a substrate.

DESCRIPTION OF EMBODIMENTS

First Embodiment

A method for manufacturing a semiconductor device, a semiconductor device, and the like according to a first embodiment will be described below with reference to the drawings as appropriate. In the embodiment described below, unless specifically mentioned, a bottom surface of a semiconductor device denotes a surface provided with an external connection terminal of the semiconductor device. An upward direction denotes a direction from the bottom surface toward the inside of the semiconductor device when vertical direction is a direction perpendicular to the bottom surface. In addition, in the embodiments described below, the term "connect" has a meaning that connected two objects are electrically continuous.

Figure 1:
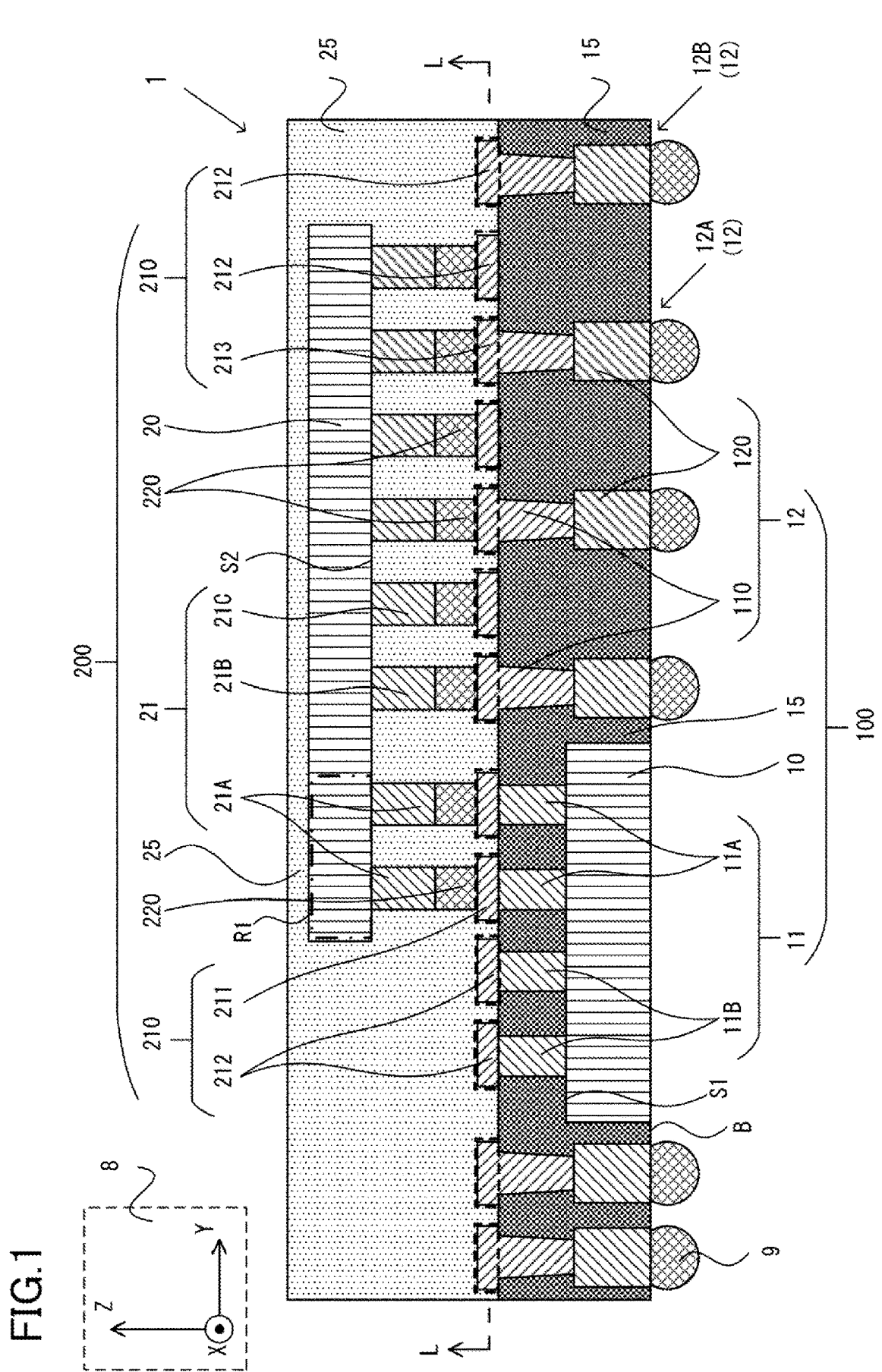
FIG. 1 is a cross-sectional view schematically illustrating a semiconductor device according to a first embodiment.

FIG. 1 is a conceptual diagram schematically illustrating a semiconductor device 1 manufactured by the method for manufacturing a semiconductor device according to the present embodiment. FIG. 1 schematically illustrates a cross section of the semiconductor device 1 perpendicular to a bottom surface B as a circuit configuration that is easy to explain. Hereinafter, an XY plane is parallel to the bottom surface B of the semiconductor device 1, a Z-axis is perpendicular to the XY plane, a Y-axis is parallel to the cross section in the figure, and an X-axis is perpendicular to the Y-axis (see a coordinate system 8).

The semiconductor device 1 includes a first layer 100 and a second layer 200. The first layer 100 includes a first semiconductor element 10, third pillar electrodes 12, and a first sealant 15. The first semiconductor element 10 includes first pillar electrodes 11. Each third pillar electrode 12 includes an internal connection part 110 and an external connection part 120. The second layer 200 includes a second semiconductor element 20, a second sealant 25, connecting layers 210, and solder layers 220. The second semiconductor element 20 includes a plurality of second pillar electrodes 21. The connecting layers 210 include first connecting layers 211, second connecting layers 212, and third connecting layers 213.

The first layer 100 is obtained by sealing the first semiconductor element 10 and the third pillar electrodes 12 with the first sealant 15. The first sealant 15 seals the space between electrodes including a plurality of first pillar electrodes 11 and a plurality of third pillar electrodes 12. As long as the first sealant 15 is an insulant to insulate the electrodes from each other, the composition of the first sealant 15 is not specifically limited. As the first sealant 15, an interlayer insulating film such as Ajinomot Build-up Film (ABF) (registered trademark), a mold resin, or the like can be used.

Types of the first semiconductor element 10 and the second semiconductor element 20 are not specifically limited. At least some of terminals of the first semiconductor element 10 are connected to some of terminals of the second semiconductor element 20. The second semiconductor element 20 is preferably configured to access data stored in the first semiconductor element 10. It is preferable that the first semiconductor element 10 is a memory chip for storing data and the second semiconductor element 20 is a control integrated circuit (IC) such as CPU. In the semiconductor device 1, it is possible to shorten the length between a terminal of the first semiconductor element 10 and a terminal of the second semiconductor element 20 to provide faster data access. Therefore, the above-described configuration allows improving a processing speed of the semiconductor device 1.

The first semiconductor element 10 has, as a first surface S1, a surface on which the terminals (not shown) are formed. In the example of FIG. 1, the plurality of first pillar electrodes 11 are formed on the first surface S1. In the example of FIG. 1, the first surface S1 is substantially parallel to the XY plane.

The first pillar electrodes 11 are connected to respective terminals of the first semiconductor element 10 formed on the first surface S1. Each first pillar electrode 11 has one end in contact with a terminal of the first semiconductor element 10 and the other end in contact with a connecting layer 210. The first pillar electrode 11 is preferably a metal plating layer including copper or the like and, more preferably, a pillar-shaped electrode. The first pillar electrode 11 may be connected to the terminal of the first semiconductor element 10 via a rewiring layer. However, in light of shortening the length between a terminal of the first semiconductor element 10 and a terminal of the second semiconductor element 20, it is preferable that the rewiring layer is not provided or has a short wiring path.

First pillar electrodes 11A out of the plurality of first pillar electrodes 11 are connected to respective terminals (not shown) of the second semiconductor element 20. The second semiconductor element 20 has, as a second surface S2, a surface on which the terminals (not shown) are formed, and each first pillar electrode 11A is connected to a second pillar electrode 21A formed in a portion of the second surface S2 facing the first surface S1 (region R1 surrounded by the dashed-dotted line) via a first connecting layer 211 and a solder layer 220. The first pillar electrode 11A has one end in contact with a terminal of the first semiconductor element 10 and the other end in contact with the first connecting layer 211. In the example of FIG. 1, the second surface S2 is substantially parallel to the XY plane.

Each first pillar electrode 11B out of the plurality of first pillar electrodes 11 has one end in contact with a terminal of the first semiconductor element 10 and the other end in contact with a second connecting layer 212. The first pillar electrode 11B is connected to a second pillar electrode 21, a third pillar electrode 12, or the like via a wiring layer in the XY plane or via a three-dimensional wiring layer with the second connecting layer 212. A terminal or the like to which the first pillar electrode 11B is connected via the other end is not specifically limited.

Each third pillar electrode 12 connects the first semiconductor element 10 or the second semiconductor element 20 to an electrode on which the semiconductor device 1 is mounted. The third pillar electrode 12 preferably includes copper and, more preferably, is a copper plating layer. In the present embodiment, the third pillar electrode 12 includes an internal connection part 110 extending along the Z-axis direction with a diameter decreasing toward the bottom surface B, and a pillar-shaped external connection part 120 with a substantially constant diameter, but this is not a limitation. In the present embodiment, the area of a cross section of the third pillar electrode 12 parallel to the second surface S2 is smallest at a position other than both ends of the third pillar electrode 12. The external connection part 120 functions as an external connection terminal, and has a lower end constituting a part of the bottom surface B of the semiconductor device 1. A solder ball 9 is formed on the portion of the external connection part 120 exposed on the bottom surface B. The internal connection part 110 is in contact with the external connection part 120 and a connecting layer 210.

Instead of the solder ball 9, an oxidation resistant layer may be formed by plating or the like on the surface of the external connection part 120 exposed from the bottom surface B.

Third pillar electrodes 12A out of the plurality of third pillar electrodes 12 are connected to respective terminals of the second semiconductor element 20. Each third pillar electrode 12A is connected to a second pillar electrode 21B formed in a portion of the second surface S2 other than the region R1 via a third connecting layer 213 and a solder layer 220. The third pillar electrode 12A has one end in contact with a solder ball 9 and the other end in contact with the third connecting layer 213.

Each third pillar electrode 12B out of the plurality of third pillar electrodes 12 has one end in contact with a solder ball 9 and the other end in contact with a second connecting layer 212. The third pillar electrode 12B is connected to a first pillar electrode 11B, a second pillar electrode 21C, or the like via a wiring layer along the XY plane or via a three-dimensional wiring layer with the second connecting layer 212. A terminal or the like to which the third pillar electrode 12B is connected via the second connecting layer 212 is not specifically limited.

The second layer 200 is obtained by sealing the second semiconductor element 20 and the connecting layers 210 with the second sealant 25. The second sealant 25 seals the space between electrodes including the plurality of second pillar electrodes 21. As long as the second sealant 25 is an insulant to insulate the electrodes from each other, the composition of the second sealant 25 is not specifically limited.

The second pillar electrodes 21 are connected to respective terminals of the second semiconductor element 20 formed on the second surface S2. Each second pillar electrode 21 has one end in contact with a terminal of the second semiconductor element 20 and the other end in contact with a solder layer 220. The second pillar electrode 21 is preferably a metal plating layer including copper or the like and, more preferably, a pillar-shaped electrode. The second pillar electrode 21 may be connected to the terminal of the second semiconductor element 20 via a rewiring layer. However, in light of shortening the length between a terminal of the first semiconductor element 10 and a terminal of the second semiconductor element 20, it is preferable that the rewiring layer is not provided or has a short wiring length.

Second pillar electrodes 21A out of the plurality of second pillar electrodes 21 are connected to respective terminals of the first semiconductor element 10. Each second pillar electrode 21A is connected to a first pillar electrode 11A facing the second surface S2 via a first connecting layer 211 and a solder layer 220. The second pillar electrode 21A has one end in contact with a terminal of the second semiconductor element 20 and the other end in contact with the solder layer 220 in contact with the first connecting layer 211.

Each second pillar electrode 21B out of the plurality of second pillar electrodes 21 is connected to a third pillar electrode 12A facing the second pillar electrode 21B in the Z-axis direction. The second pillar electrode 21B has one end in contact with a terminal of the second semiconductor element 20 and the other end in contact with a solder layer 220 in contact with a third connecting layer 213.

Each second pillar electrode 21C out of the plurality of second pillar electrodes 21 has one end in contact with a terminal of the second semiconductor element 20 and the other end in contact with a solder layer 220 in contact with a second connecting layer 212. The second pillar electrode 21C is connected to a first pillar electrode 11B, a third pillar electrode 12B, or the like via a wiring layer along the XY plane or via a three-dimensional wiring layer with the second connecting layer 212. A terminal or the like to which the second pillar electrode 21C is connected via the other end is not specifically limited.

Each connecting layer 210 connects between two pillar electrodes selected from a first pillar electrode 11, a second pillar electrode 21, and a third pillar electrode 12. The composition of the connecting layer 210 is not specifically limited, but preferably includes copper. The connecting layer 210 is, more preferably, a copper plating layer. The thickness of the connecting layer 210 in the Z-axis direction can be 1 μm to a few tens of preferably 5 μm to 15 μm, for example, about 10 μm.

Each first connecting layer 211 connects a first pillar electrode 11A to a second pillar electrode 21A. The first connecting layer 211 is in contact with the first pillar electrode 11A on the lower side of the figure (a minus side of the Z-axis), and in contact with the solder layer 220 formed at the end of the second pillar electrode 21A on the upper side of the figure (a plus side of the Z-axis).

Figure 2:
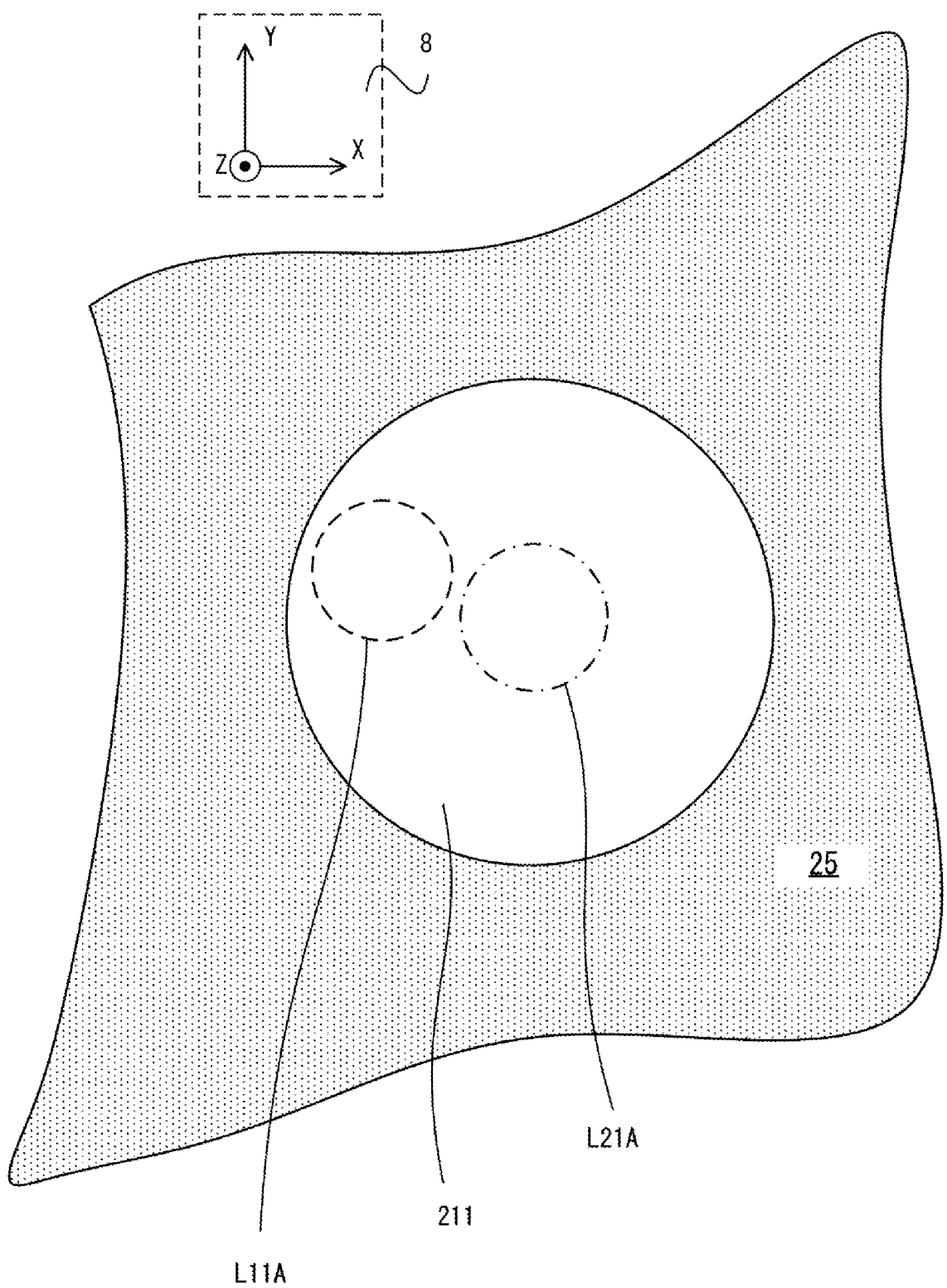
FIG. 2 is an L-L cross sectional view schematically illustrating a first connecting layer 211 in FIG. 1.

FIG. 2 shows a part of an L-L cross section schematically illustrating an example of a first connecting layer 211 in FIG. 1. As described above, the first connecting layer 211 is sealed and surrounded by the second sealant 25. In FIG. 2, the dashed line L11A represents an XY plane projection of a coupling surface of the first pillar electrode 11A connected to the first connecting layer 211, and the dashed-dotted line L21A represents an XY plane projection of a coupling surface of the second pillar electrode 21A connected to the first connecting layer 211. Herein, the coupling surface is a surface of the first pillar electrode 11A or the second pillar electrode 21A in contact with the first connecting layer 211.

In the example of FIG. 2, the dashed line L11A does not overlap the dashed-dotted line L21A. This positional deviation of the first pillar electrode 11A from the second pillar electrode 21A is caused by misalignment that occurs when the first semiconductor element 10 is placed on a substrate via a surface opposite to the first surface S1. Hereinafter, bonding of the first semiconductor element 10 onto the substrate via this surface is referred to as die bonding as appropriate. The positional deviation in FIG. 2 means that, if the first connecting layer 211 had only an extent almost equal to that of the second pillar electrode 21A in the XY plane, the first pillar electrode 11A and the second pillar electrode 21A would not conduct with each other via the first connecting layer 211, or a defective product with insufficient electrical continuity would be manufactured.

In the present embodiment, the first connecting layer 211 is formed such that the area of a cross section thereof parallel to the first surface S1 is larger than the areas of respective cross sections of the first pillar electrode 11A and the second pillar electrode 21A parallel to the first surface. In order to avoid interference with an adjacent connecting layer 210 when the first pillar electrodes 11 and the second pillar electrodes 21 are densely formed, it is preferable that the first connecting layer 211 is about 1.2 times to 1.5 times larger in diameter, or larger in area by 40% to 130% than the first pillar electrode 11A and the second pillar electrode 21A. Alternatively, the area of the cross section of the first connecting layer 211 parallel to the first surface S1 may be set based on variation along a direction parallel to the XY plane in die bonding so that the first pillar electrode 11A and the second pillar electrode 21A conduct with each other and a desired manufacturing efficiency can be achieved.

It is also preferable that, in light of ensuring electrical continuity and avoiding interference with an adjacent connecting layer 210, either or both of a second connecting layer 212 and a third connecting layer 213 are about 1.2 times to 1.5 times larger in diameter, or larger in area by 40% to 130% than the first pillar electrode 11 and the second pillar electrode 21 connected to them.

In the example of FIG. 2, for a simple explanation of the effect of the first connecting layer 211, it is assumed that the XY plane projections of the first pillar electrode 11A and the second pillar electrode 21A do not overlap each other. However, this is intended for explaining an example of variation during manufacturing. The first pillar electrode 11A and the second pillar electrode 21A are preferably designed to have a positional relationship such that the XY plane projections of the surfaces of the first pillar electrode 11A and the second pillar electrode 21A in contact with the first connecting layer 211 overlap each other.

The length along a conductive portion connecting a terminal of the first semiconductor element 10 to a terminal of the second semiconductor element 20 via a first connecting layer 211 is preferably 100 μm or less. The shorter this length is, the faster processing the semiconductor device 1 can perform. In terms of accuracy and the like in manufacturing, this length can be 30 μm or more as appropriate.

Returning to FIG. 1, the length along a conductive portion connecting a terminal of the first semiconductor element 10 to the surface of an external connection part 120 exposed from the bottom surface B via a third connecting layer 213 is preferably 500 μm or less. The shorter this length is, the faster data transmission/reception the semiconductor device 1 can perform with the outside. In terms of accuracy and the like in manufacturing, this length can be 200 μm or more as appropriate.

As long as each solder layer 220 is capable of fixing the second semiconductor element 20 and a connecting layer 210 together as solder, it is not specifically limited. The solder layer 220 is preferably solder for flip-chip bonding.

(Method for Manufacturing Semiconductor Device 1)

FIGS. 3A to 5C are views schematically illustrating a YZ cross section of an intermediate 1000 in the process of manufacturing a semiconductor device 1 for explaining a flow of the method for manufacturing a semiconductor device 1. Although the coordinate system 8 is shown only in FIG. 3A, the same positional relationship applies to FIGS. 3A to 5C. FIGS. 3A to 3D, 4A to 4D, and 5A to 5C illustrate steps in order. In general, a plurality of semiconductor devices 1 is simultaneously formed on one substrate SB, but only one semiconductor device 1 is shown in FIGS. 3A to 5C for simplicity.

Figure 3A:
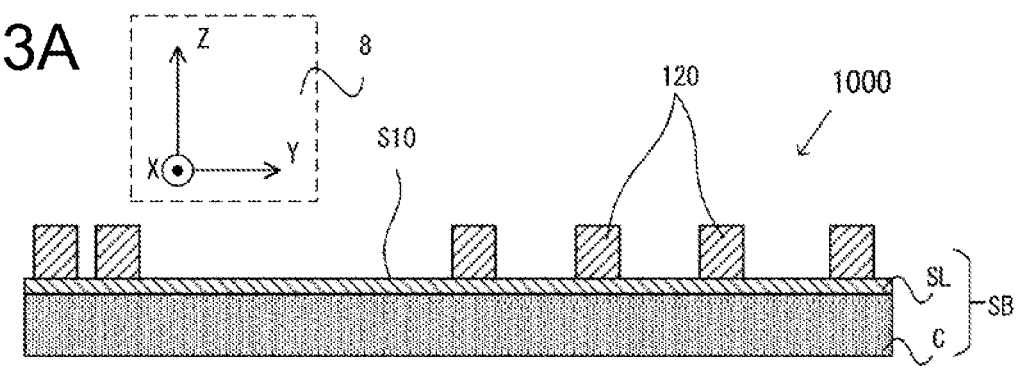
FIGS. 3A to 3D are cross-sectional views schematically illustrating steps for explaining a method for manufacturing a semiconductor device according to the first embodiment.

FIG. 3A is a view schematically illustrating, as an explanation of a first step in the process of manufacturing the semiconductor device 1, forming the external connection parts 120 as pillar electrodes on a substrate surface S10 of the substrate SB. In the example of FIG. 3A, the substrate SB includes a supporting substrate C and a seed layer SL, as well as a peeling layer, not shown, formed between the supporting substrate C and the seed layer SL. The peeling layer is a layer for peeling the supporting substrate C. A copper plate is used for the supporting substrate C. However, the material thereof is not specifically limited as long as the external connection parts 120 can be formed upward on the substrate SB, and a glass substrate may be used.

A method for forming the external connection parts 120 is not specifically limited. For example, the external connection parts 120 can be formed by forming a resist pattern corresponding to the external connection parts 120 on the seed layer SL, applying copper plating, and removing the resist pattern.

Figure 3B:
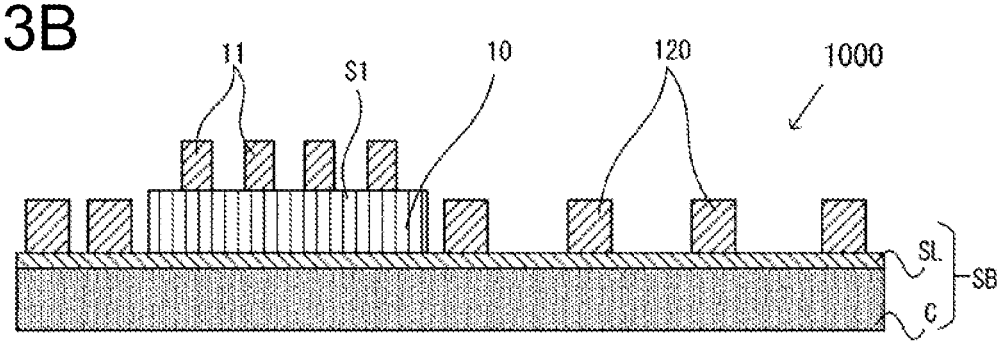

FIG. 3B is a conceptual diagram of the intermediate 1000 for explaining a second step in the process of manufacturing the semiconductor device 1. In the second step, the first semiconductor element 10 is arranged on the substrate SB. The first semiconductor element 10 is a singulated semiconductor element with the first pillar electrodes 11 formed on respective terminals on the first surface S1 of the main body of the semiconductor element. The first semiconductor element 10 is bonded at a position of the substrate surface S10 where the external connection parts 120 are not formed, via the surface opposite to the first surface S1 using a bonding adhesive for die bonding or the like.

Figure 3C:
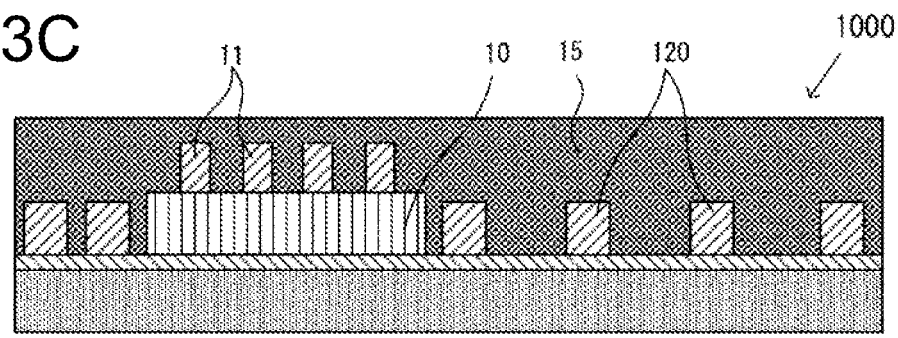

FIG. 3C is a conceptual diagram of the intermediate 1000 for explaining a third step in the process of manufacturing the semiconductor device 1. In the third step, the first semiconductor element 10 is sealed with the first sealant 15. A sealing method is not specifically limited and can be, for example, compression molding or the like. In this sealing, the first pillar electrodes 11 and the external connection parts 120 as the substrate-side pillar electrodes are sealed with the first sealant 15.

Figure 3D:
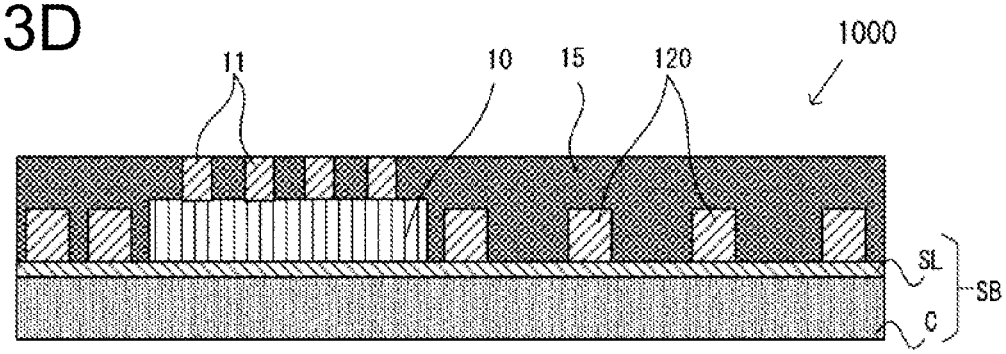

FIG. 3D is a conceptual diagram of the intermediate 1000 for explaining a fourth step in the process of manufacturing the semiconductor device 1. In the fourth step, the first sealant 15 is grinded to expose upper surfaces of the first pillar electrodes 11 from the first sealant 15.

The first sealant 15 may be irradiated with a laser to form openings in the first sealant 15 to expose at least a part of an end of each of the first pillar electrodes 11 and the external connection parts 120. This method is efficient specifically in a case where the tips of the first pillar electrodes 11 and the external connection parts 12 on the plus side of the Z-axis direction are located at substantially the same level.

Figure 4A:
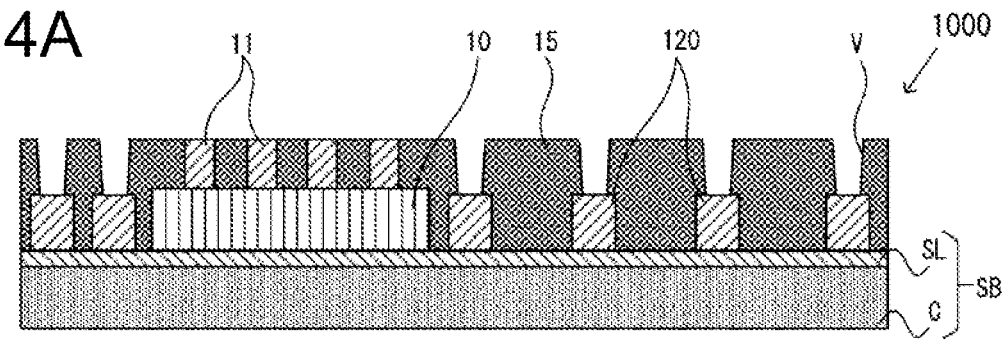
FIGS. 4A to 4D are cross-sectional views schematically illustrating steps following FIGS. 3A to 3D.

FIG. 4A is a conceptual diagram of the intermediate 1000 for explaining a fifth step in the process of manufacturing the semiconductor device 1. In the fifth step, openings are formed in the first sealant 15 to expose the external connection parts 120. According to the fourth and fifth steps, parts of the first sealant 15 are removed to expose the ends of the first pillar electrodes 11 and the ends of the external connection parts 120. In the fifth step, laser irradiation from the plus side to the minus side of the Z-axis forms holes V as the openings at positions corresponding to the external connection parts 120 in the XY plane in the first sealant 15. According to characteristics of laser processing, each hole V has a diameter decreasing toward the minus side along the Z-axis direction and has, for example, a truncated cone shape.

Figure 4B:
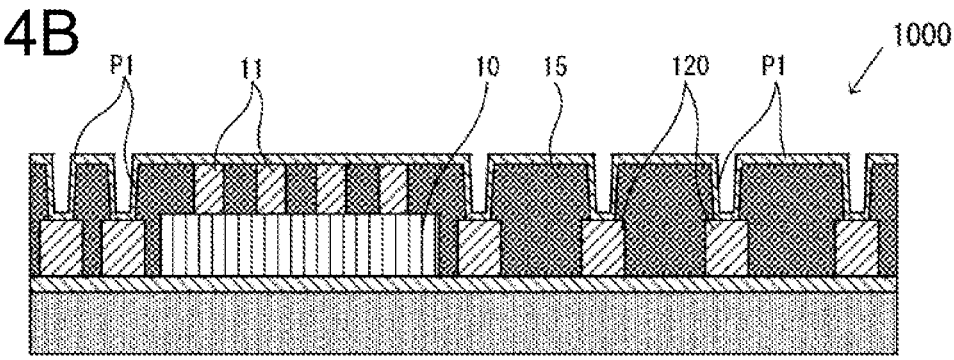

FIG. 4B is a conceptual diagram of the intermediate 1000 for explaining a sixth step in the process of manufacturing the semiconductor device 1. In the sixth step, a first plating layer P1 connected to the external connection parts 120 and the first pillar electrodes 11 is formed on the first sealant 15 by copper plating or the like. In the sixth step, the copper plating can be applied to the upper surface of the first sealant 15, the side surfaces of the holes V, the upper surfaces of the first pillar electrodes 11, and the upper surfaces of the external connection parts 120 by non-electrolytic plating.

Figure 4C:
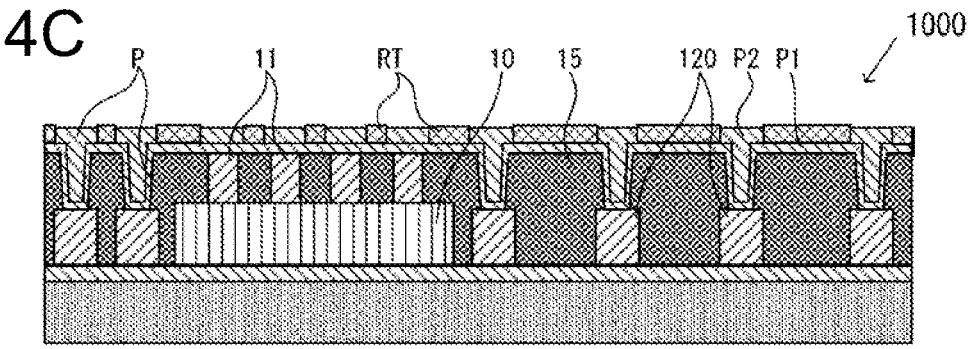

FIG. 4C is a conceptual diagram of the intermediate 1000 for explaining a seventh step in the process of manufacturing the semiconductor device 1. In the seventh step, a resist layer RT and a second plating layer P2 are formed on the first plating layer P1 formed in the sixth step. For example, the first plating layer P1 is first laminated with a dry-film photoresist, and the dry-film photoresist is exposed to light through a photomask patterned based on a pattern of the connecting layers 210, and developed. The second plating layer P2 is formed by electrolytic plating using the first plating layer P1 as a seed layer to reach a level such that openings of the resist layer RT are at least partially filled. A combined plating layer of the first plating layer P1 and the second plating layer P2 is referred to as plating layer P.

Figure 4D:
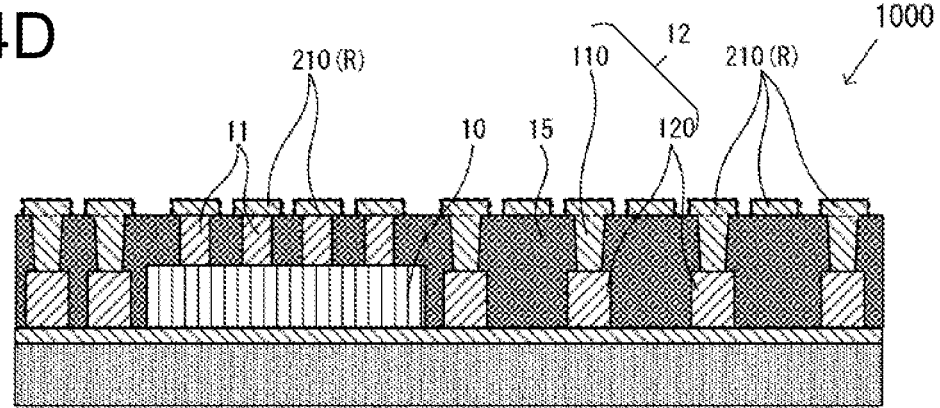

FIG. 4D is a conceptual diagram of the intermediate 1000 for explaining an eighth step in the process of manufacturing the semiconductor device 1. In the eighth step, a residual plating layer R is formed. A part of the plating layer P on the upper side of the first sealant 15 is removed to form the connecting layers 210 as the residual plating layer R. A method for removing the part of the plating layer P is not specifically limited, and etching can remove the plating layer P to form the residual plating layer R in the pattern of the connecting layers 210.

Portions of the plating layer P formed inside the holes V become the internal connection parts 110 each having a diameter decreasing toward the minus side of the Z-axis and having, for example, a truncated cone shape. The internal connection parts 110 and the external connection parts 120 constitute the third pillar electrodes 12. As described with reference to FIG. 2, the shape and size of each connecting layer 210 to be formed are set so as to ensure sufficient electrical continuity between a first pillar electrode 11A and a second pillar electrode 21A even if misalignment has occurred in a direction along the XY plane during die bonding of the first semiconductor element 10.

Note that, an arbitrarily patterned wiring layer or a metal layer for easy coupling of the second semiconductor element 20 may be formed by electrolytic plating as appropriate.

Figure 5A:
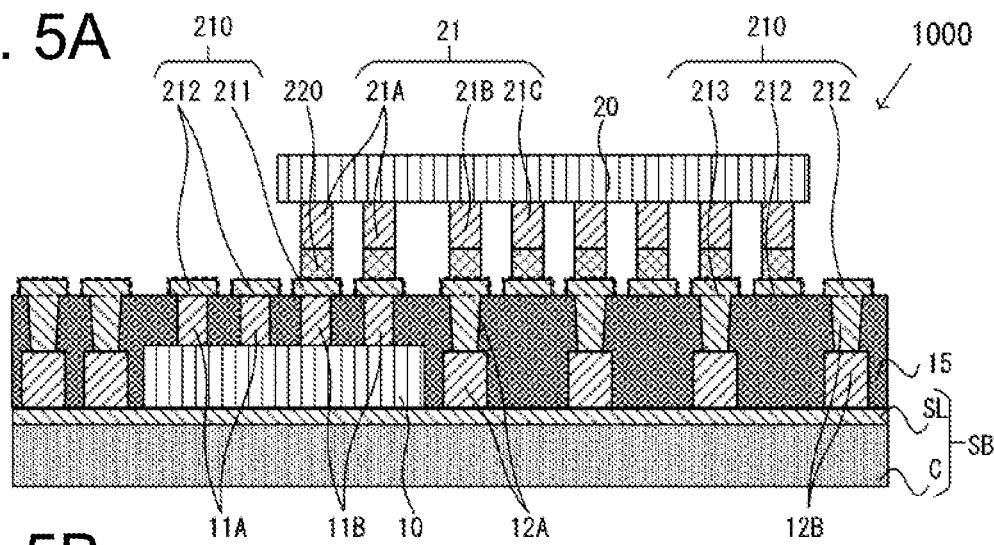
FIGS. 5A to 5C are cross-sectional views schematically illustrating steps following FIGS. 4A to 4D.

FIG. 5A is a conceptual diagram of the intermediate 1000 for explaining a ninth step in the process of manufacturing the semiconductor device 1. In the ninth step, coupling of the second semiconductor element 20 is performed. In the ninth step, the second semiconductor element 20 is coupled to connecting layers 210 by flip-chip bonding. The second semiconductor element 20 is mounted on the connecting layers 210 by, for example, controlled collapse chip connection (C4), and coupled to the connecting layers 210 by reflow under a nitrogen atmosphere.

The coupling of the second semiconductor element 20 turns the first pillar electrodes 11 and the second pillar electrodes 21 connected to the first connecting layers 211 into the first pillar electrodes 11A and the second pillar electrodes 21A, respectively. The second pillar electrodes 21 and the third pillar electrodes 12 facing each other along the Z-axis direction are turned into the second pillar electrodes 21B and the third pillar electrodes 12A, respectively. The connecting layers 210 connecting therebetween are turned into the third connecting layers 213. The connecting layers 210 other than the first connecting layers 211 and the third connecting layers 213 are turned into the second connecting layers 212. The second pillar electrodes 21 and the third pillar electrodes 12 connected to the second connecting layers 212 are turned into the second pillar electrodes 21C and the third pillar electrodes 12B, respectively.

The second semiconductor element 20 may be coupled to, instead of the connecting layers 210, metal layers or wiring layers formed on the connecting layers 210. A chip capacitor or the like may be arranged between connecting layers 210 or the like.

Figure 5B:
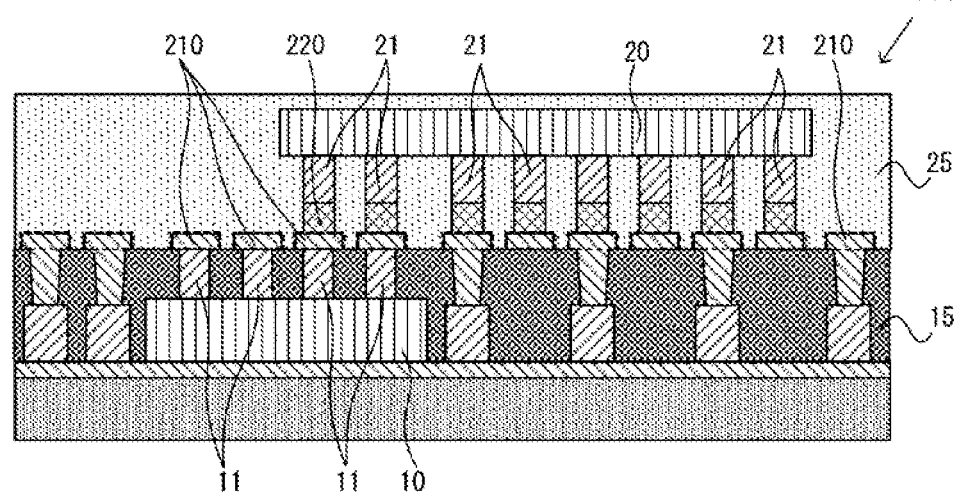

FIG. 5B is a diagram for explaining a tenth step in the process of manufacturing the semiconductor device 1. In the tenth step, the second semiconductor element 20 is sealed with the second sealant 25. A sealing method is not specifically limited and can be, for example, compression molding or the like. In the tenth step, the connecting layers 210 and the second pillar electrodes 21 are sealed such that the first sealant 15 is in contact with the second sealant 25.

Figure 5C:
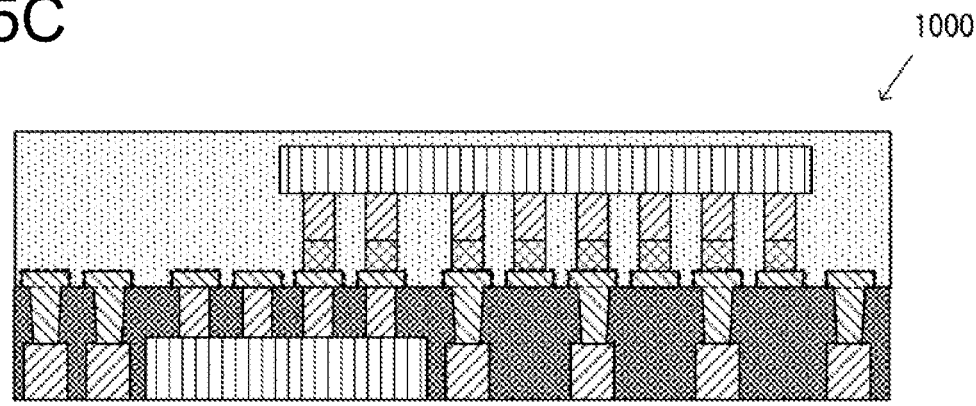

FIG. 5C is a conceptual diagram of the intermediate 1000 for explaining an eleventh step in the process of manufacturing the semiconductor device 1. In the eleventh step, the substrate SB is removed. A removing method is not specifically limited, and can be peeling, etching, or the like. In a case of the substrate SB including the supporting substrate C, the peeling layer, and the seed layer SL, it is possible to separate the supporting substrate C using the peeling layer and then remove the seed layer SL by etching.

After the eleventh step, the solder balls 9 are formed on the surfaces of the external connection parts 120 exposed from the bottom surface B. Then, singulation is performed using a dicing blade or the like to complete the semiconductor device 1 (FIG. 1) configured as a semiconductor package.

Instead of the solder balls 9, an oxidation resistant layer, as a single layer or multiple layers, may be formed on each external connection part 120 by nickel, palladium, or gold plating or the like.

According to the above-described embodiment, the following effects can be obtained.

(1) A method for manufacturing a semiconductor device of the present embodiment includes: forming a substrate-side pillar electrode (external connection part 120) on a substrate surface S10 that is one of surfaces of a substrate SB; placing, at a position of the substrate surface S10, a first semiconductor element 10 having a first surface S1 on which a first pillar electrode 11 is formed, via a surface opposite to the first surface S1, the external connection part 120 being not formed at the position; sealing the external connection part 120 and the first pillar electrode 11 with a first sealant 15; removing a part of the first sealant 15 to expose an end of the external connection part 120 and an end of the first pillar electrode 11; forming, on the first sealant 15, a plating layer P electrically connected to the external connection part 120 and the first pillar electrode 11 by plating; removing a part of the plating layer P to form a residual plating layer R; coupling a second semiconductor element 20 onto the residual plating layer R or a metal layer or a wiring layer formed on the residual plating layer R; and sealing the residual plating layer R and the second semiconductor element 20 using a second sealant 25 such that the first sealant 15 is in contact with the second sealant 25. This allows for reducing the likelihood of insufficient electrical continuity in wiring in the semiconductor device 1 due to misalignment in arranging the first semiconductor element 10 on the substrate SB.

(2) In the method for manufacturing a semiconductor device of the present embodiment, the residual plating layer R in contact with the first pillar electrode 11 may have a cross section parallel to the first surface S1, an area of the cross section being larger than an area of a surface of the first pillar electrode 11 in contact with the residual plating layer R. This allows for more surely reducing the likelihood of insufficient electrical continuity in wiring in the semiconductor device 1.

(3) In the method for manufacturing a semiconductor device of the present embodiment, in removing a part of the first sealant 15, a hole V as an opening may be formed in the first sealant 15 by a laser to expose the end of the external connection part 120. This allows for efficient formation of a third pillar electrode 12.

(4) In the method for manufacturing a semiconductor device of the present embodiment, after the end of the external connection part 120 and the end of the first pillar electrode 11 are exposed, the plating layer P may be formed without forming an insulating layer on an exposed surface. This allows for manufacturing the semiconductor device 1 more efficiently through omitting formation of the insulating layer.

(5) In the method for manufacturing a semiconductor device of the present embodiment, a length along a conductive portion electrically connecting a terminal of the first semiconductor element 10 to a terminal of the second semiconductor element 20 may be 100 μm or less. This allows the semiconductor device 1 to perform faster processing.

(6) In the method for manufacturing a semiconductor device of the present embodiment, a length along a conductive portion electrically connecting a terminal of the second semiconductor element 20 to a surface of the third pillar electrode 12 exposed from the first sealant 15 may be 500 μm or less. This allows the semiconductor device 1 to perform faster data transmission/reception with the outside.

(7) A semiconductor device according to the present embodiment includes a first semiconductor element 10 having a first surface S1 provided with a first pillar electrode 11, and a second semiconductor element 20 having a second surface S2 provided with a plurality of second pillar electrodes 21, the semiconductor device 1 further including: a first connecting layer 211 electrically connecting a second pillar electrode 21A formed in a first portion (region R1) of the second surface S2 to the first pillar electrode 11A, the first portion facing the first surface S1; a third pillar electrode 12 electrically connecting a second pillar electrode 21 formed in a second portion of the second surface S2 to a substrate on which the semiconductor device 1 is mounted, the second portion being different from the first portion; a first sealant 15 sealing the first pillar electrode 11 and the third pillar electrode 12; and a second sealant 25 in contact with the first sealant 15, the second sealant 25 sealing the plurality of second pillar electrodes 21 and a plurality of connecting layers 210. This can realize the semiconductor device 1 that can be produced more efficiently.

(8) In the semiconductor device according to the present embodiment, an area of a cross section of the internal connection part 110 parallel to the second surface S2 gradually decreases toward the minus direction along the Z-axis. This makes the area of the internal connection part 110 in contact with the external connection part 120 smaller, which ensures electrical continuity without difficulty even if a little deviation occurs, in the fifth step, when forming the hole V in the first sealant 15 by a laser with reference to the first pillar electrode 11 exposed from the first sealant 15.

(9) In the semiconductor device according to the present embodiment, no insulating layer may be provided between the first sealant 15 and the second sealant 25. This allows for producing the semiconductor device 1 more efficiently through omitting formation of the insulating layer.

Following alteration examples also fall within the scope of the present invention, and can be combined with the above-described embodiment. In the alteration examples below, a part indicating a structure or function similar to that in the above embodiment is designated by the same reference sign, and an explanation thereof is omitted as appropriate.

Alteration Example 1

In the above embodiment, a plurality of first semiconductor elements 10 may be connected to a second semiconductor element 20.

Figure 6:
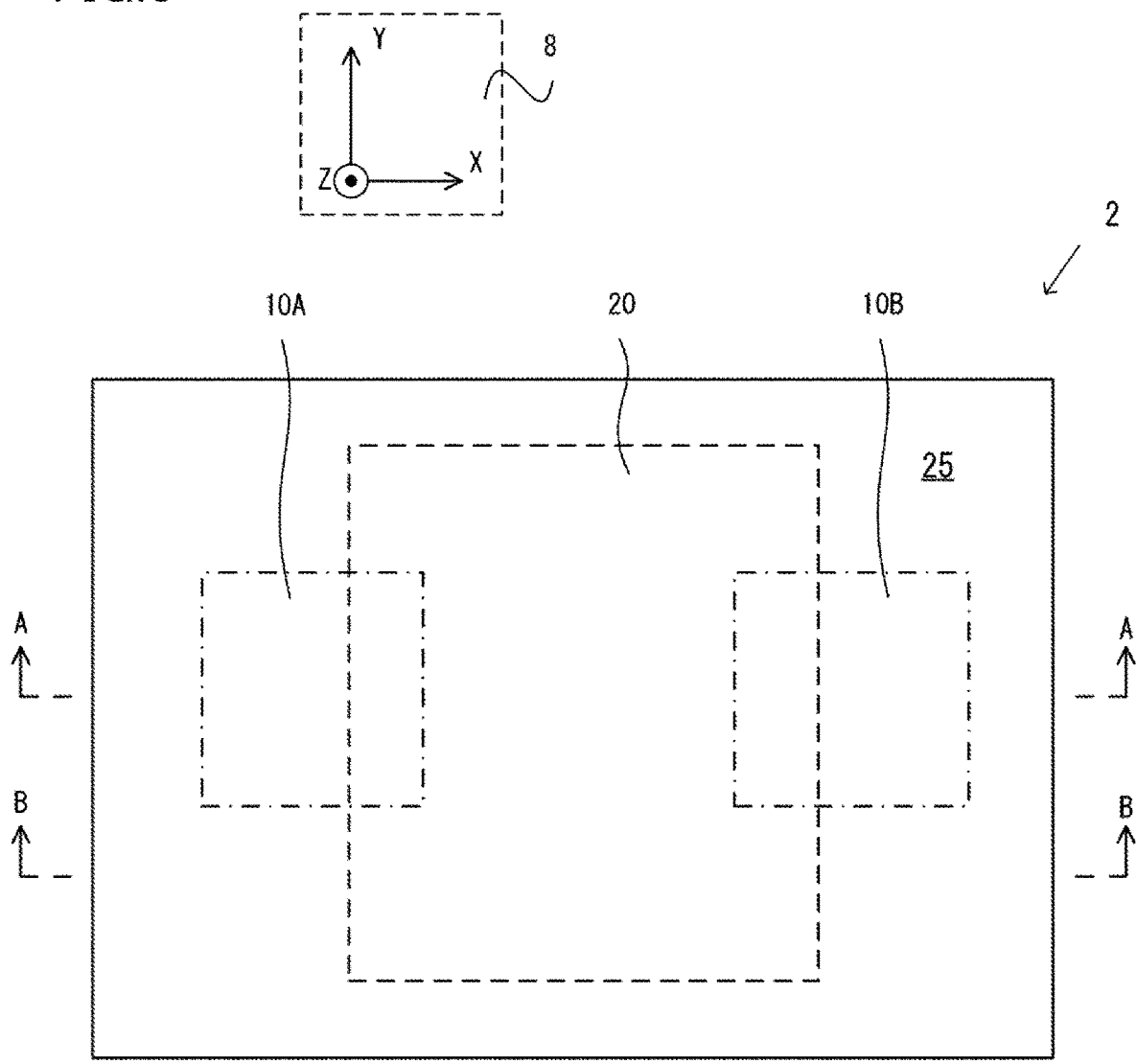
FIG. 6 is a top view of a semiconductor device according to an alteration example 1 schematically illustrating an arrangement of first semiconductor elements and a second semiconductor element.

FIG. 6 is a top view schematically illustrating a configuration of a semiconductor device 2 according to the present alteration example. The semiconductor device 2 includes two first semiconductor elements 10A and 10B, and a second semiconductor element 20. FIG. 6 shows a second sealant 25 on an upper surface of the semiconductor device 2. The dashed-dotted lines represent respective outlines of the first semiconductor elements 10A and 10B inside the semiconductor device 2. The dashed line represents an outline of the second semiconductor element 20 inside the semiconductor device 2.

Figure 7A:
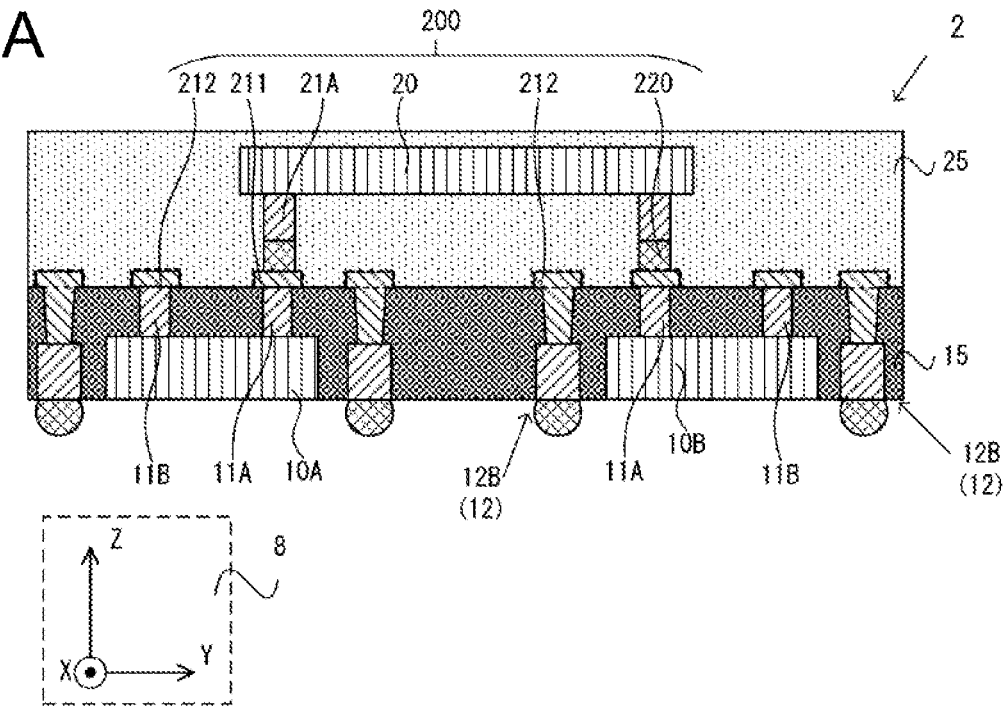
FIG. 7A is an A-A cross-sectional view of FIG. 6.
Figure 7B:
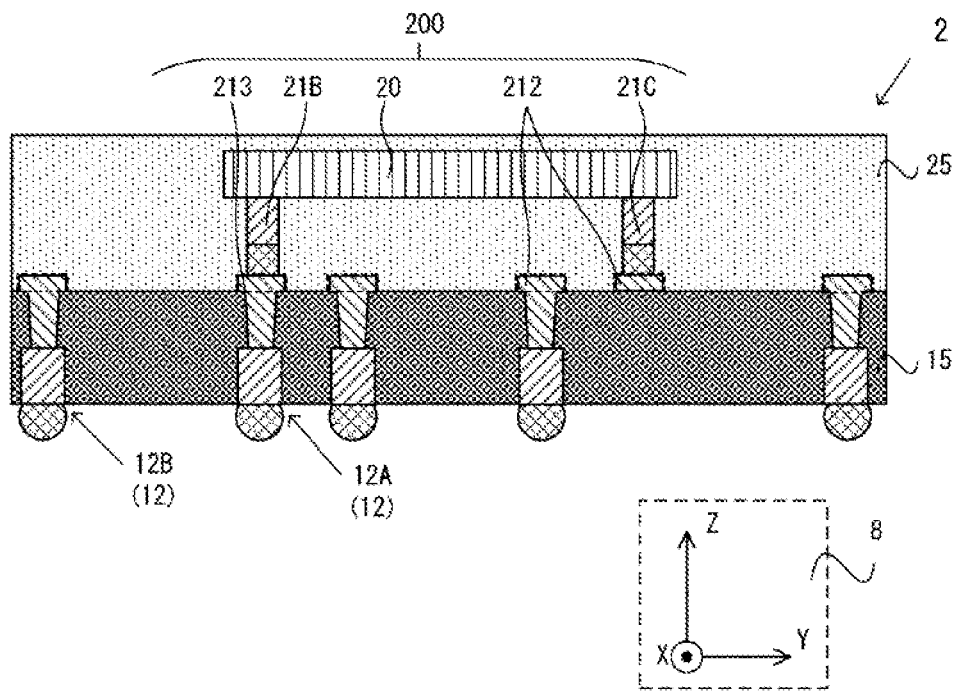
FIG. 7B is a B-B cross sectional view of FIG. 6.

FIGS. 7A and 7B are an A-A cross sectional view and a B-B cross sectional view of FIG. 6, respectively, schematically illustrating the configuration of the semiconductor device 2 according to the present alteration example. In addition to 10A and 10B indicating the first semiconductor elements, the reference signs indicate similar parts to those in the above embodiment.

As shown in the A-A cross section view, the first semiconductor element 10A or 10B and the second semiconductor element 20 are arranged so as to face each other. As shown in the A-A cross sectional view, the first semiconductor elements 10A and 10B include respective first pillar electrodes 11A each connected to a second pillar electrode 21A via a first connecting layer 211 and a solder layer 220. The B-B cross section does not include the first semiconductor element 10A or 10B, and a first pillar electrode 11A and a second pillar electrode 21A are not present. In FIGS. 7A and 7B, in portions where the first semiconductor element 10A or 10B does not face the second semiconductor element 20, first pillar electrodes 11B, second pillar electrodes 21B and 21C, second connecting layers 212, a third connecting layer 213, third pillar electrodes 12A and 12B are arranged as in the above-described embodiment.

Note that FIGS. 6, 7A, and 7B illustrate only an exemplary arrangement of the parts, and each electrode can be arranged in various manners as long as connectability is provided.

Alteration Example 2

In the alteration example 1 described above, the two first semiconductor elements 10 are connected to the one second semiconductor element 20, but three or more first semiconductor elements 10 may be connected to one second semiconductor element 20. Alternatively, two or more second semiconductor elements 20 may be connected to one first semiconductor element 10.

Figure 8A:
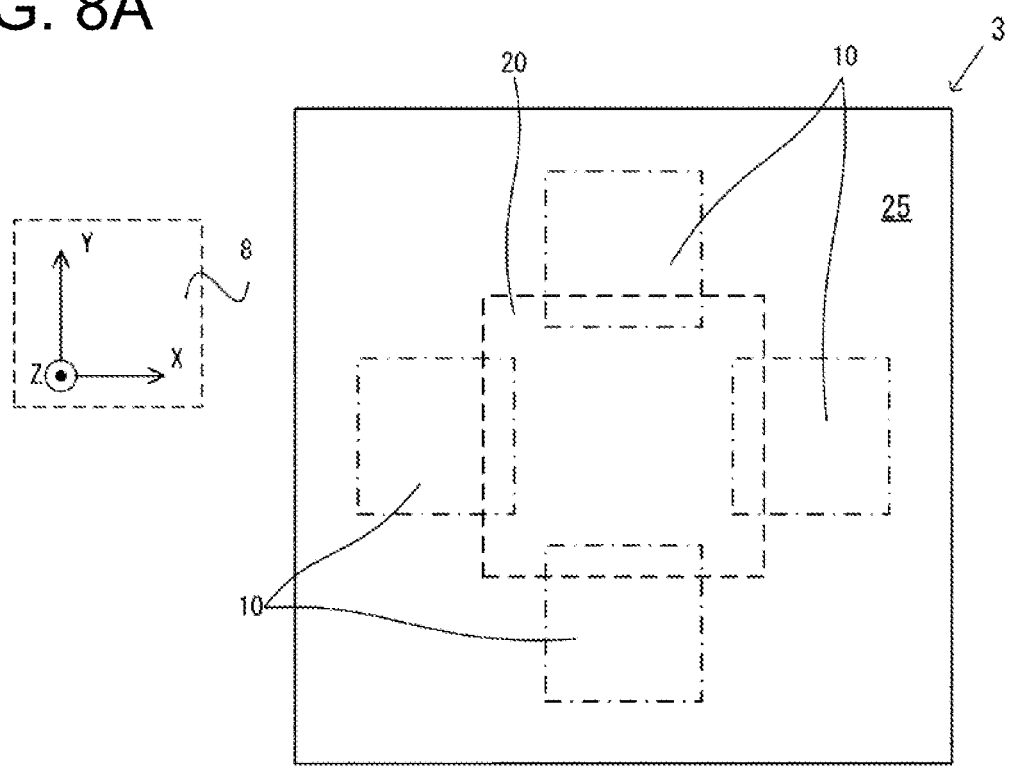
FIG. 8A is a top view of a semiconductor device according to an alteration example 2 schematically illustrating an arrangement of first semiconductor elements and a second semiconductor element.

FIG. 8A is a top view schematically illustrating a configuration of a semiconductor device 3 according to the present alteration example. The semiconductor device 3 includes one second semiconductor element 20 and four first semiconductor elements 10. FIG. 8A shows a second sealant 25 on an upper surface of the semiconductor device 3. The dashed-dotted lines represent respective outlines of the four first semiconductor elements 10 inside the semiconductor device 3. The dashed line represents an outline of the second semiconductor element 20 inside the semiconductor device 3. The same applies to FIG. 8B.

In the semiconductor device 3 according to the present alteration example, each of the first semiconductor elements 10 is arranged in one-to-one correspondence to overlap each side of the second semiconductor element 20 that is rectangular in a top view. This arrangement can simplify a positional relationship between terminals of the second semiconductor element 20 and the first semiconductor elements 10 connected thereto, so that it is easy to design the semiconductor device 3.

Alteration Example 3

In the alteration example 2 described above, each of the first semiconductor elements 10 is arranged in one-to-one correspondence with each side of the second semiconductor element 20 that is rectangular in a top view. However, first semiconductor elements 10 may be arranged at respective corresponding vertices of a rectangular shape of a second semiconductor element 20 that is rectangular in a top view.

Figure 8B:
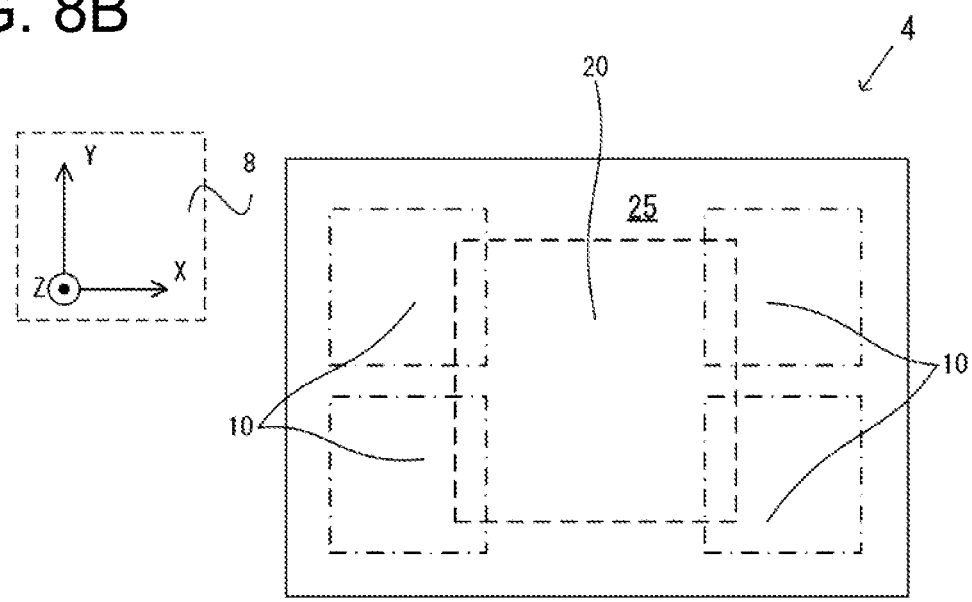
FIG. 8B is a top view of a semiconductor device according to an alteration example 3 schematically illustrating an arrangement of first semiconductor elements and a second semiconductor element.

FIG. 8B is a top view schematically illustrating a configuration of a semiconductor device 4 according to the present alteration example. In the semiconductor device 4, the first semiconductor elements 10 overlap respective vertices of the second semiconductor element 20 in a top view. In the semiconductor device 4, for example, two first semiconductor elements 10 are arranged over each of two opposite sides of the rectangular shape of the second semiconductor element 20 that is rectangular in a top view. This allows the semiconductor device 4 to be further downsized.

The present invention is not limited to the details of the embodiments described above. Another mode conceivable within the technical idea of the present invention also falls within the scope of the present invention.

REFERENCE SIGNS LIST 1, 2, 3, 4: semiconductor device
8: coordinate system
9: solder ball
10, 10A, 10B: first semiconductor element
11, 11A, 11B: first pillar electrode
12, 12A, 12B: third pillar electrode
15: first sealant
20: second semiconductor element
21, 21A, 21B, 21C: second pillar electrode
25: second sealant
100: first layer
110: internal connection part
120: external connection part
200: second layer
210: connecting layer
211: first connecting layer
212: second connecting layer
213: third connecting layer
220: solder layer
1000: intermediate
C: supporting substrate
P1: first plating layer
P2: second plating layer
P: plating layer
R: residual plating layer
R1: portion of second surface facing first surface
RT: resist layer
S1: first surface
S2: second surface
S10: substrate surface
SB: substrate
SL: seed layer
V: hole

The invention claimed is:

1. A semiconductor device comprising:
a first semiconductor element having a first surface provided with a first pillar electrode; and a second semiconductor element having a second surface provided with a plurality of second pillar electrodes, the semiconductor device further comprising:
a connecting layer electrically connecting a second pillar electrode formed in a first portion of the second surface to the first pillar electrode, the first portion facing the first surface;
a third pillar electrode electrically connecting a second pillar electrode formed in a second portion of the second surface to an outside of the semiconductor device, the second portion being different from the first portion;
a first sealant sealing the first pillar electrode and the third pillar electrode; and
a second sealant in contact with the first sealant, the second sealant sealing the plurality of second pillar electrodes,
wherein an end face of the first pillar electrode, an end face of the third pillar electrode and an end face of the first sealant are on a same plane, and
the connecting layer is formed on the same plane.

2. The semiconductor device according to claim 1, wherein
the connecting layer in contact with the first pillar electrode has a cross section parallel to the first surface, an area of the cross section being larger than an area of a surface of the first pillar electrode in contact with the connecting layer.

3. The semiconductor device according to claim 1, wherein
an area of a cross section of the third pillar electrode parallel to the second surface is smallest at a position other than both ends of the third pillar electrode.

4. The semiconductor device according to claim 1, wherein
no insulating layer is provided between the first sealant and the second sealant.

5. The semiconductor device according to claim 1, wherein
a length along a conductive portion electrically connecting a bottom portion of the first pillar electrode to a terminal of the second semiconductor element is 100 μm or less.

6. The semiconductor device according to claim 1, wherein
a length along a conductive portion electrically connecting an upper portion of the second pillar electrodes to a surface of an external connection terminal is 500 μm or less.

* * * * *